(12) United States Patent
Marchack et al.

(10) Patent No.: US 11,056,643 B2
(45) Date of Patent: Jul. 6, 2021

(54) MAGNETIC TUNNEL JUNCTION (MTJ) HARD MASK ENCAPSULATION TO PREVENT REDEPOSITION

(71) Applicant: International Business Machines Corporation, Armonk, NY (US)

(72) Inventors: Nathan P. Marchack, New York, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/239,012

(22) Filed: Jan. 3, 2019

(65) Prior Publication Data

US 2020/0220073 A1    Jul. 9, 2020

(51) Int. Cl.
  *H01L 43/12*  (2006.01)
  *H01L 43/02*  (2006.01)
  *H01L 27/22*  (2006.01)

(52) U.S. Cl.
  CPC ............ *H01L 43/12* (2013.01); *H01L 27/222* (2013.01); *H01L 43/02* (2013.01)

(58) Field of Classification Search
  None
  See application file for complete search history.

(56) References Cited

U.S. PATENT DOCUMENTS

| | | | |
|---|---|---|---|
| 6,985,384 B2 | 1/2006 | Costrini et al. | |
| 7,001,783 B2 | 2/2006 | Costrini et al. | |
| 7,696,551 B2 | 4/2010 | Xiao et al. | |
| 8,450,119 B2 | 5/2013 | Torng et al. | |
| 8,574,928 B2 | 11/2013 | Satoh et al. | |
| 8,722,543 B2 | 5/2014 | Belen et al. | |
| 8,883,520 B2 | 11/2014 | Satoh et al. | |
| 9,070,869 B2 | 6/2015 | Jung et al. | |

(Continued)

FOREIGN PATENT DOCUMENTS

| WO | WO2004032144 A2 | 4/2004 |
|---|---|---|
| WO | WO3004032144 A2 | 4/2004 |

OTHER PUBLICATIONS

Office Action dated Dec. 30, 2019 from related U.S. Appl. No. 16/238,846.

*Primary Examiner* — Ali Naraghi
(74) *Attorney, Agent, or Firm* — Scully, Scott, Murphy & Presser, P.C.; Daniel P. Morris

(57) ABSTRACT

A semiconductor structure and fabrication method of forming a semiconductor structure. In the method there is provided an electrically conductive structure embedded in an interconnect dielectric material layer of a magnetoresistive random access memory device. A conductive landing pad is located on a surface of the electrically conductive structure. A multilayered magnetic tunnel junction (MTJ) structure and an MTJ cap layer is formed on the landing pad. Then there is formed a metal hardmask layer on a surface of said MTJ cap layer, the etch stop layer being subject to lithographic patterning and etching to form a patterned hardmask pillar structure. An encapsulating is performed to encapsulate, using an insulating material film, a top surface and sidewall surfaces of said patterned hardmask layer. Subsequent etch processing forms an MTJ stack having sidewalls aligned to the patterned hardmask without impacting MTJ stack performance.

5 Claims, 4 Drawing Sheets

(56) References Cited

U.S. PATENT DOCUMENTS

| | | |
|---|---|---|
| 9,269,893 B2 | 2/2016 | Lu et al. |
| 9,343,659 B1 | 5/2016 | Lu et al. |
| 9,450,180 B1 | 9/2016 | Annunziata et al. |
| 9,608,200 B2 | 3/2017 | Shen et al. |
| 9,705,071 B2 | 7/2017 | Annunziata et al. |
| 9,847,473 B2 | 12/2017 | Hsu et al. |
| 10,002,904 B2 | 6/2018 | Annunziata et al. |
| 10,069,064 B1 | 9/2018 | Haq et al. |
| 10,461,251 B2 * | 10/2019 | Aggarwal ............. H01L 27/222 |
| 10,522,751 B2 * | 12/2019 | Shen ...................... H01L 43/12 |
| 2004/0063223 A1 | 4/2004 | Costini et al. |
| 2004/0084400 A1 | 5/2004 | Costrini et al. |
| 2005/0146927 A1 | 7/2005 | Costini |
| 2010/0327248 A1 | 12/2010 | Khoueir et al. |
| 2015/0104882 A1 | 4/2015 | Jung et al. |
| 2015/0188033 A1 | 7/2015 | Lamborn et al. |
| 2016/0104834 A1 * | 4/2016 | Toko ....................... H01L 43/08 |
| | | 257/421 |
| 2016/0197268 A1 * | 7/2016 | Yakabe ................... H01L 43/12 |
| | | 257/421 |
| 2016/0308112 A1 * | 10/2016 | Tan ........................... C23F 1/12 |
| 2016/0351799 A1 | 12/2016 | Xue et al. |
| 2017/0033282 A1 * | 2/2017 | Wang ...................... H01L 43/12 |
| 2017/0092850 A1 | 3/2017 | Lee et al. |
| 2017/0148976 A1 * | 5/2017 | Annunziata ............. H01L 43/02 |
| 2017/0186944 A1 | 6/2017 | Annunziata et al. |
| 2019/0088864 A1 | 3/2019 | Cho et al. |
| 2019/0103554 A1 | 4/2019 | Aggarwal et al. |
| 2019/0173004 A1 | 6/2019 | Deshpande et al. |
| 2019/0288188 A1 | 9/2019 | Sonoda et al. |
| 2019/0363248 A1 | 11/2019 | Shen et al. |

* cited by examiner

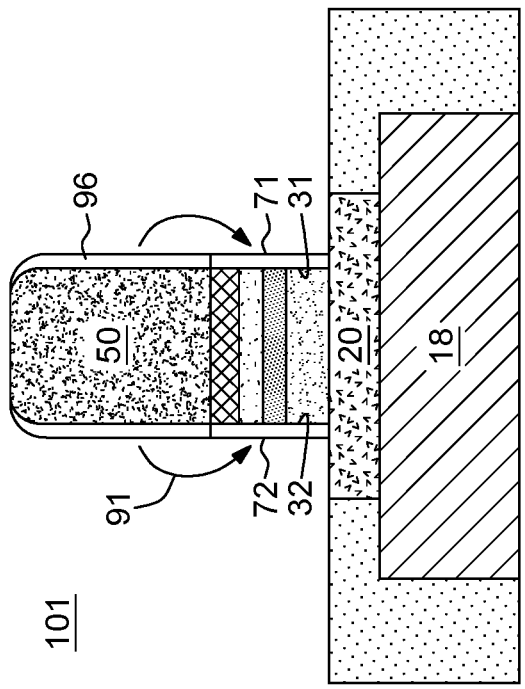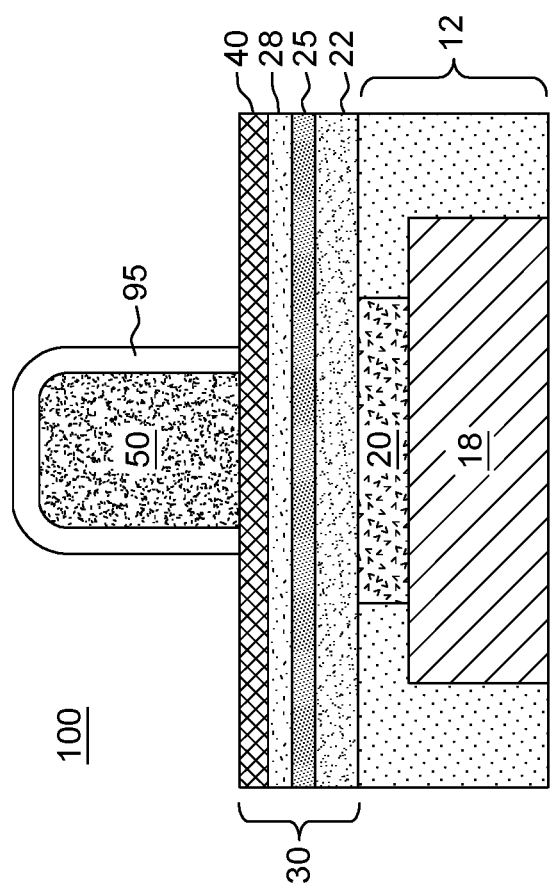

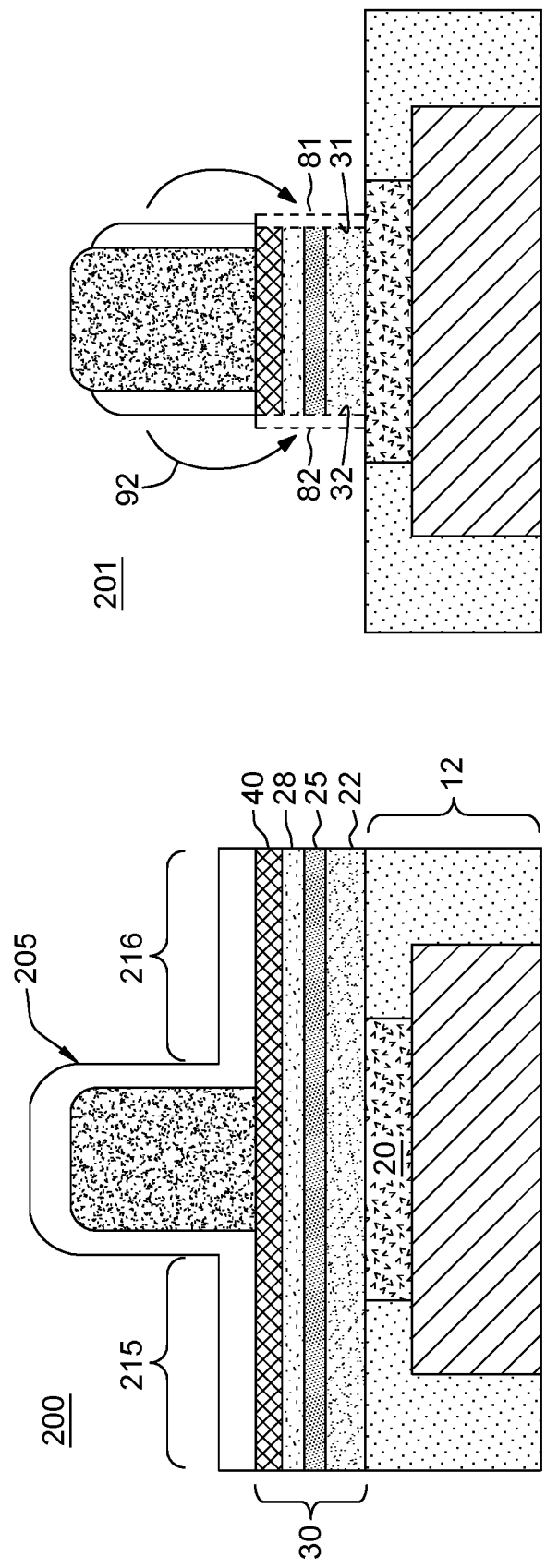

MAGNETIC TUNNEL JUNCTION (MTJ) HARD MASK ENCAPSULATION TO PREVENT REDEPOSITION

BACKGROUND

The present invention relates to a magnetic tunnel junction and its fabrication method, and more particularly, to a magnetic tunnel junction with a hard mask encapsulation that prevents degradation of the performance of a magnetic tunnel junction (MTJ) structure.

MRAM is a non-volatile random access memory technology in which data is stored by magnetic storage elements. These elements are typically formed from two ferromagnetic layers, each of which can hold a magnetization, separated by a thin dielectric layer. One of the two layers is a permanent magnet set to a particular polarity; the other layer's magnetization can be changed to match that of an external field to store memory. Such a configuration is known as magnetic tunnel junction (MTJ).

In leading-edge or neuromorphic computing systems, a MTJ structure (or pillar) is typically embedded within a back-end-of-the-line (BEOL) structure, a metal hard mask is typically formed above a multilayered MTJ structure, and the metal hardmask is used as an etch mask to provide the MTJ structure.

Current semiconductor manufacturing techniques of an MTJ bit, i.e., a MTJ stack, requires patterning of the fixed layer, free layer, and tunnel layer. However, current processing techniques for patterning of MTJ stacks encounter issues with redeposition, as the stack is often etched using physical sputtering.

However, redeposition of conductive metal on a sidewall of the MTJ device, particularly across the tunnel barrier, can create a short circuit.

Moreover, as the metal hardmask often doubles as the top electrode in an MTJ cell, it is also a source of potential redeposition. This layer is exposed to the stack etch for the entire duration and thus can serve as a source of potential metal redeposition.

SUMMARY

An encapsulated hardmask structure is provided for controlling the redeposition of metal products from the hardmask by encapsulating the hardmask structure prior to the MTJ stack etch.

A fabrication method to produce such a structure with encapsulated hard mask prior to the MTJ stack etch is also provided to improve production and reliability of MTJ devices and MRAM arrays and prevent degradation of the performance of a magnetic tunnel junction (MTJ) structure.

In accordance with a first aspect of the invention, there is provided a semiconductor structure. The semiconductor structure comprises: a first electrically conductive structure embedded in an interconnect dielectric material layer and located in a magnetoresistive random access memory (MRAM) device area; a conductive landing pad located on a surface of the first electrically conductive structure in the MRAM device area; a multi-layered magnetic tunnel junction (MTJ) structure located on the conductive landing pad; a metal cap layer formed on a surface of the MTJ stack; a metal hardmask structure formed on a surface of the cap layer; and a conformal metal oxide layer encapsulating a top surface and sidewall surfaces of the patterned hardmask layer.

In a second aspect of the invention, there is further provided: a semiconductor structure. The semiconductor structure comprises: a first electrically conductive structure embedded in an interconnect dielectric material layer and located in a magnetoresistive random access memory (MRAM) device area; a conductive landing pad located on a surface of the first electrically conductive structure in the MRAM device area; a multi-layered magnetic tunnel junction (MTJ) structure located on the conductive landing pad; a metal cap layer formed on a surface of the .MTJ stack; a patterned metal hardmask layer on a surface of the cap layer; and an insulating material film encapsulating a top surface and sidewall surfaces of the patterned hardmask layer.

Further to this aspect, the encapsulating insulating material film is a dielectric film deposited over the hardmask.

Further to this aspect, the encapsulating insulating material film is a metal possessing a low-sticking coefficient deposited over the hardmask.

In a third aspect of the invention, there is provided: a method of forming a semiconductor structure. The method comprises: providing a first electrically conductive structure embedded in a first interconnect dielectric material layer and located in a magnetoresistive random access memory (MRAM) device area, wherein a conductive landing pad is located on a surface of the first electrically conductive structure; forming a multilayered magnetic tunnel junction (MTJ) structure and a MTJ cap layer on the conductive landing pad; forming a metal hardmask layer on a surface of said MTJ cap layer; and patterning, utilizing an etching process, a metal hardmask layer to provide a patterned hardmask layer; and encapsulating, using an insulating material film, a top surface and sidewall surfaces of said patterned hardmask layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2A is a sectional view of a magnetic tunnel junction (MTJ) structure of an MRAM bit prior to hardmask encapsulation having a layer of induced metal oxide according to one embodiment of the invention;

FIG. 2B is a sectional view of the magnetic tunnel junction (MTJ) structure of FIG. 2A after sputter etching of the MTJ layer stack showing a potential redistributing of metal oxide (insulating) material along the etched MTJ stack sidewalls;

FIG. 3A is a sectional view of a magnetic tunnel junction (MTJ) structure of an MRAM bit prior to hardmask encapsulation having a deposited layer of dielectric material or a low-coefficient metal material according to a further embodiment of the invention;

FIG. 3B is a sectional view of the magnetic tunnel junction (MTJ) structure of FIG. 3A after sputter etching of the MTJ layer stack showing a potential redistributing of dielectric material or a low-coefficient metal along the etched MTJ stack sidewalls.

DETAILED DESCRIPTION OF THE PREFERRED EMBODIMENTS

Figure 1A:
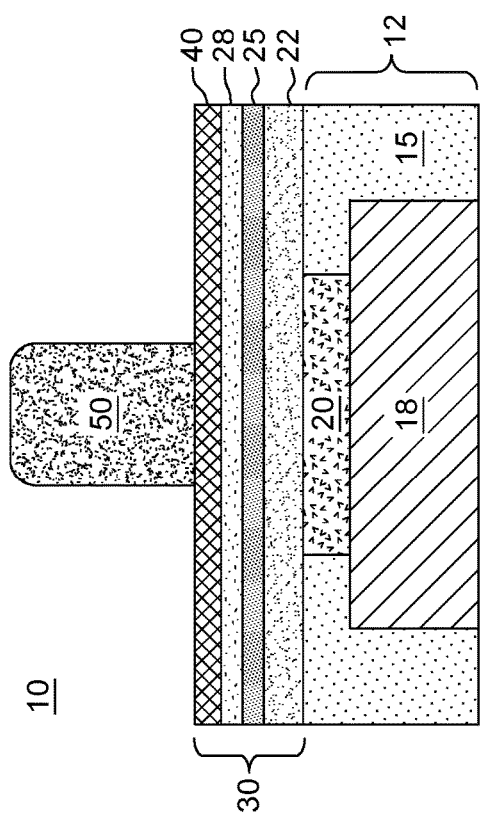
FIG. 1A is a sectional view of a magnetic tunnel junction (MTJ) structure of an MRAM bit prior to hardmask encapsulation.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) structure (i.e., pillar) for data storage, a bit line and a word line. In general, the MTJ's electrical resistance will be high or low based on the relative magnetic states of certain layers within the MTJ structure. Data is written to the MTJ structure by applying certain magnetic fields or charge currents to switch the magnetic states of the layers of the MTJ structure. Data is read by detecting the resistance of the MTJ structure. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ structure results in a change to the MTJ resistance, hence the name "Magnetoresistive" RAM.

Referring first to FIG. 1A, there is illustrated a first exemplary MRAM bit structure of the present application during an early stage of fabrication including a multilayered MTJ structure 30 formed above a lower metal interconnect level 12, an MTJ cap layer 40 formed on the multilayered MTJ structure 30, and an etch stop hardmask layer 50 formed on the MTJ cap. Examples of material forming MTJ conductive cap include Ru, RuOx material deposited using lithographic patterning and deposition techniques.

In the sectional view of MRAM element 10 depicted in FIG. 1A is the lower interconnect level structure 12 including a first electrically conductive structure or bottom electrode 20 embedded in an interconnect dielectric substrate 15. A conductive pad metal can include TaN, Ta, TiN, T, W. A diffusion barrier liner may be present between the electrically conductive contact structure 20 and the interconnect dielectric material layer 15. Conductively contacting bottom surface of bottom electrode 20 in alignment with the pad 20 is a conductive (metal) interconnect structure 18 formed in the interconnect dielectric material layer 15.

In some embodiments, the lower interconnect level is positioned above a middle-of-the line (MOL) level that includes a MOL dielectric material layer (not shown) having a metal contact structure embedded therein. The MOL level may be located above a front-end-of-the-line (FEOL) level (not shown) in which a plurality of FEOL semiconductor devices such as, for example, transistors, capacitors and/or resistors are formed.

The lower interconnect dielectric material layer 15 may include an inorganic dielectric material or one containing a non-trivial amount of organic material. In one embodiment, the lower interconnect dielectric material layer 15 may be non-porous. In another embodiment, the lower interconnect dielectric material layer 15 may be porous. Some examples of suitable dielectric materials (i.e., interconnect dielectrics) that may be used as the interconnect dielectric material layer 15 include, but are not limited to, silicon dioxide, silsesquioxanes, C doped oxides (i.e., organosilicates) that includes atoms of Si, C, O and H, or multilayers thereof.

The lower interconnect dielectric material layer 15 typically has a dielectric constant that is about 3.0 or less, with a dielectric constant of about 1.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 15 may vary depending upon the type of dielectric material(s) used. In one example, the first interconnect dielectric material layer 15 may have a thickness from 50 nm to 1000 nm. Other thicknesses that are lesser than, or greater than, the aforementioned thickness range may also be employed in the present application for the thickness of the lower interconnect dielectric material layer 15. The first interconnect dielectric material layer 15 may be formed utilizing any deposition process including, but not limited to, CVD, PECVD or spin-on coating.

The lower interconnect dielectric material layer 15 is then processed to include a plurality of openings (not shown). A single opening and/or a plurality of openings can be formed into the MRAM device area and any non-MRAM device area at the interconnect dielectric material layer 15. In the illustrated embodiment of FIG. 1A, a single opening is formed in the MRAM device area. The openings, which are used to house, the first electrically conductive structures 18 may extend entirely through the first interconnect dielectric material layer 15. The openings may be via openings, line openings or combined via/line openings. The openings may be formed by lithography and etching.

A diffusion barrier material layer may then be formed into the opening and on the topmost surface of the interconnect dielectric material layer 15. The diffusion barrier material layer includes a diffusion barrier material (i.e., a material that serves as a barrier to prevent a conductive material such as copper from diffusing there through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, chemical vapor deposition (CVD), plasma-enhanced CVD (PECVD), atomic layer deposition (ALD), physical vapor deposition (PVD), sputtering, chemical solution deposition or plating.

An electrically conductive metal or metal alloy is formed into each opening and, is present, on the diffusion barrier material layer (not shown). Examples of electrically conductive metals that may be used in the present application include copper (Cu), aluminum (Al), or tungsten (W), while an example of an electrically conductive metal alloy is a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the interconnect dielectric material layer 15. The planarization stops on a topmost surface of the interconnect dielectric material layer 15.

A dielectric capping layer (not shown) of pre-determined thickness can be formed upon the lower interconnect level utilizing deposition techniques. In some embodiments, the dielectric capping layer is formed first and thereafter the conductive landing pad 20 is formed within an opening provided in the dielectric capping layer. In other embodiments, the conductive landing pad 20 can be formed prior to the dielectric capping layer and then the dielectric capping layer is formed. In such an embodiment, an etch back process may be employed. In yet other embodiments, no dielectric capping layer is formed.

In any of the embodiments, conductive landing pad 20 is formed upon a surface of first electrically conductive structure 18 in the MRAM device area. The surface of the electrically conductive structure 18 in which the landing pad 20 is formed upon may be a non-recessed surface or a recessed surface. The conductive landing pad 20 may be composed of Ta, TaN, Ti, TiN, Ru, RuN, RuTa, RuTaN, Co, CoWP, CoN, W, WN or any combination thereof. The conductive landing pad 20 may have a thickness from 2 nm to 25 nm; other thicknesses are possible and can be used in the present application as the thickness of the conductive landing pad 20. The conductive landing pad 22 may be formed by a deposition process such as, for example, sputtering, ALD, CVD or PVD. An etch back process, a planarization process (such as, for example, chemical mechanical polishing), or a patterning process (such as, for example, lithography and etching) may follow the deposition of the conductive material that provides the conductive landing pad 20. In some embodiments and as illustrated in FIG. 1A, the conductive landing pad 20 has a topmost surface that is coplanar with an interconnect dielectric material layer 15. Alternatively, the conductive landing pad 20 has a topmost surface that is above, or below, the topmost surface of a dielectric capping layer (not shown).

As stated above, a multilayered MTJ structure 30 is located above the lower interconnect level. The multilayered MTJ structure 30 can be formed by utilizing one or more deposition processes such as, for example, CVD, PECVD, PVD, or sputtering. The multilayered MTJ structure 30 may include a stack, from bottom to top, of a reference layer 22, a tunnel barrier 25, and a free layer 28. The reference layer 22 has a fixed magnetization. The "pinned" reference layer 22 of the multilayered MTJ structure 30 may be composed of a metal or metal alloy that includes one or more metals exhibiting high spin polarization. In alternative embodiments, exemplary metals for the formation of the reference layer include iron, nickel, cobalt, chromium, boron, or manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier 25 of the multilayered MTJ structure 30 is composed of an insulator material and is formed at such a thickness as to provide an appropriate tunneling resistance. Exemplary materials for the tunnel barrier include magnesium oxide (MgO), aluminum oxide ($Al_2O_3$), and titanium oxide, or materials of higher electrical tunnel conductance, such as semiconductors or low-bandgap insulators.

The free layer 28 of the multilayered MTJ structure 30 is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

After providing the multilayered MTJ structure 30, the MTJ cap layer 40 is formed on the multilayered MTJ structure 30. The MTJ cap layer 40 may be composed of Nb, NbN, W, WN, Ta, TaN, Ti, TiN, Ru, Mo, Cr, V, Pd, Pt, Rh, Sc, Al or other high melting point metals or conductive metal nitrides, however the cap layer is meant to serve as an etch stop for the hard mask patterning process and should thus be resistant to the chemistry used to pattern the metal hardmask layer formed directly over it. The MTJ cap layer 40 may be formed utilizing a deposition process including, for example, CVD, PECVD, ALD, PVD, sputtering, chemical solution deposition or plating. The MTJ cap layer 40 may have a thickness from 2 nm to 25 nm; other thicknesses are possible and can be used in the present application as the thickness of the MTJ cap layer 40.

After providing the MTJ cap layer 40, a metal hardmask is conventionally formed over the MTJ cap 40. The MTJ cap hardmask can be formed utilizing a deposition process including, for example, CVD, PECVD, ALD, PVD, sputtering, chemical solution deposition or plating. Exemplary materials for the etch stop hardmask layer typically include "high-sticking" coefficient conductive material such as W, WN, Ta, TaN, Ru, Mo, Cr, V, Pd, Pt, Rh, Sc, Al or other high melting point metals or conductive metal nitrides. The upper hardmask layer may have a thickness from 50 nm to 100 nm; other thicknesses are possible and can be used in the present application as the thickness of the upper hardmask layer.

Using conventional lithographic patterning and plasma etching or RIE, the metal hardmask 50 is formed which can doubly function as a top electrode for the MRAM bit.

Figure 4:
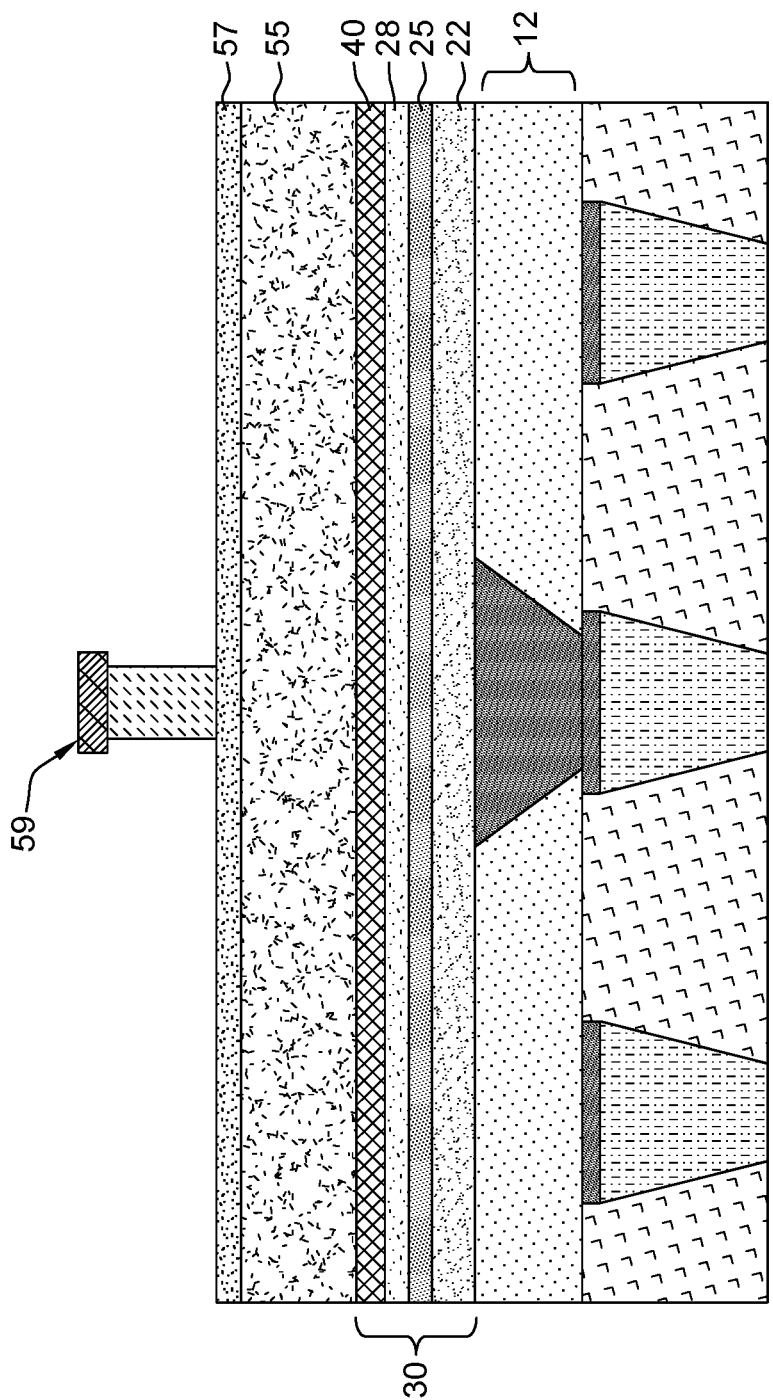
FIG. 4 shows an example process that can include depositing a metal layer over the MTJ stack cap layer which serves as hardmask and top electrode to be formed.

FIG. 4 shows an example process that can include depositing a TaN layer 55 over the MTJ stack cap layer 40 which serves as hardmask and top electrode to be formed. A low temperature oxide (LTO) layer 57 may be formed on top the hardmask layer 55. In an embodiment shown in FIG. 4, lithographic mask layer (e.g., organic pianarization layer (OPL)) is deposited over the blanket metal HM film 55. A pillar shape is obtained using patterning of the lithographic mask to form a pillar mask 59 (e.g., a negative image of a hole mask) which is used to define the MTJ stack. This may be followed by a halogen-based plasma etch of the LTO and TaN layers (e.g. using $Cl_2$, $CHF_3$, or some combination thereof) to transfer this pillar/cylinder through the TaN HM layer 55. The resulting structure after the halogen-based plasma etch is shown as MRAM structure 10 of FIG. 1A. The TaN etch lands on an etch stop layer which is described as the MTJ cap (layer 40). Ru serves as a good stop layer for Cl/F chemistries and protects the MTJ layer from damage due to diffusion of those reactants.

Then, the wafers onto which the MRAM is formed are subjected to a downstream plasma ($H_2O/N_2$) to passivate remnant surface Cl. The remaining OPL is then stripped using an $O_2$ plasma, followed by DI Water Rinse. The DI Water rinse is critical for preventing Cl residual corrosion.

Figure 1B:
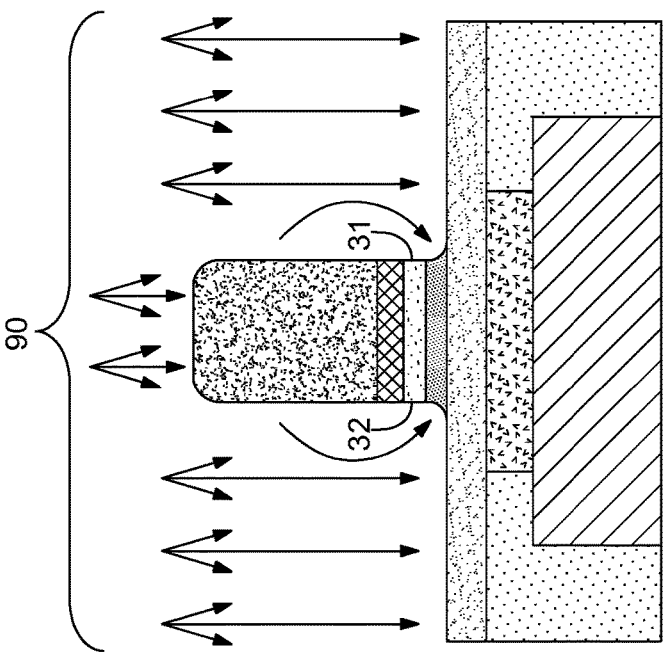
FIG. 1B depicts a physical etch process to form a MTJ stack having sidewall in alignment with outer sidewalls of a hardmask layer.

In accordance with conventional manufacturing techniques, as shown in FIG. 1B, to form the MRAM bit, the MTJ stack is mechanically etched, e.g., via mechanical sputtering, to remove portions of the stack MTJ stack layer 30 not covered by the hardmask 50. In FIG. 1B, the path of sputter deposition 90 is shown by arrows.

Figure 1C:
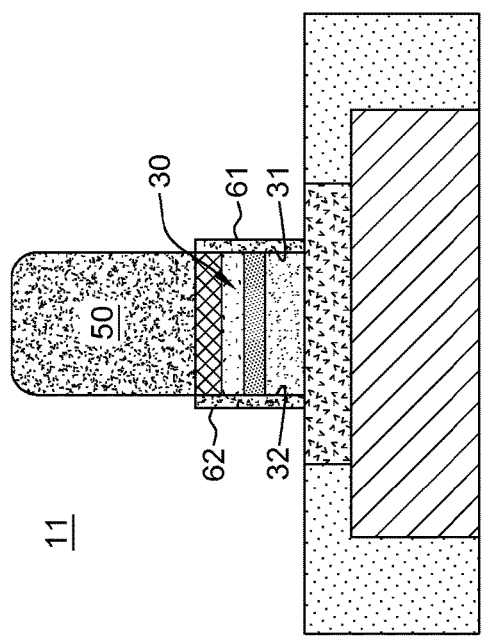
FIG. 1C is a sectional view of a magnetic tunnel junction (MTJ) structure of FIG. 1A according to the prior art that results from sputter etching to form the MTJ layer stack and showing a potential redistributing of metal along the etched MTJ stack sidewalls.

In such conventional implementations, this post etching of the stack 30, using sputtering or ion beam etching results in the outermost sidewalls of the MTJ stack and MTJ cap being vertically aligned with outermost sidewalls of the etch stop mask layer 50. An additional result of the sputtering is the causing of residue from the hardmask to form deposits on the sidewalls 31, 32 of the MTJ stack. FIG. 1C shows a result of post-etching of the stack 30 using conventional hard mask (metal) sputtering techniques depicting a residue metal material 61, 62 from the hardmask 50 being displaced (by sputtering) and depositing on the respective sidewalls 31, 32 of the MTJ stack. Any residue can electrically short the MTJ stack 30.

Continuing with the above-described method steps, in accordance with a first embodiment of the present application, FIG. 2A shows a structure and method 100 for preventing a redeposition of potential hardmask residue during manufacture (e.g., ion-beam or sputter etching) to form a MJT bit structure. In one embodiment, after the hardmask structure 50 of the MJT (magnetoresistive) device structure 10 shown in FIG. 1A is formed, it is then subject to an oxidation process, e.g., an oxygen plasma treatment, by exposing the surfaces of the hardmask film(s) to a plasma of oxygen gas (e.g., plasma oxidation) or by using thermal oxidation as long as oxidation environment will not negatively affect a magnetic moment or magnetic material of the MTJ pinned layer or free layer. Plasma oxidation of the hardmask can also be used, with the energetic nature of the plasma discharge providing energy to drive the oxidation reaction in place of thermal energy.

As shown in FIG. 2A, a result of the induced oxidation, a thin layer 95 of oxidized metal material (e.g., oxides of metals such as Nb, NbN, W, WN, Ta, TaN, Ti, TiN, Ru, Mo, Cr, V, Pd, Pt, Rh, Sc, Al) is created at the surfaces of the metal hardmask structure 50. In particular, FIG. 2A shows the resulting structure including the thin oxidized metal layer 95 on the MTJ structure of FIG. 1A. Forming this layer advantageously results in a smoothing of the sidewalls 51, 52 of the hard mask prior to conducting the MTJ stack sputter etch. In the structure of FIG. 2A, the height of the hardmask pillar 50 may range anywhere from between about 70 nm to about 100 nm while the diameter of the hardmask pillar 50 may range anywhere from between 35 nm-50 nm. The thickness of the oxidized layer or oxidized film formed on the stack may range anywhere from about 5 nm to about 15 nm. The MTJ cap layer 40 may or may not be oxidized.

After forming the thin metal-oxide layer 95 on the metal hardmask surface, conducting of the subsequent dry or mechanical sputter etching 90 such as shown in FIG. 1B can displace the oxidized material 91 of metal oxide layer 95 and any resultant film redeposited on the sidewall of the MTJ stack would be insulating and thus would not contribute to shorts across the tunnel barrier.

FIG. 2B shows a resulting structure 101 after etching the MTJ stack layers 30 of FIG. 1A using sputtering or a similar physical etch process. The MTJ stack layer 30 is all but removed except under the hardmask feature 50 while the thin metal oxide layer 96 remaining at the surface of the metal hardmask 50 is reduced in thickness due to the sputtering. Any redeposited material(s) that results on the sidewalls 31 and 32 has been oxidized and thus does not cause shorts. That is, the resultant redeposited dielectric layers 71, 72 formed at respective MTJ stack sidewalls 31, 32, is non-conductive and does not impact MTJ device performance.

FIG. 3A shows a further structure and method 200 according to a further embodiment for preventing a redeposition of potential hardmask residue during manufacture of the MRAM bit structure. In one embodiment, after the hardmask structure 50 of the MJT (magnetoresistive) device structure 10 shown in FIG. 1A is formed, a dielectric layer 205 or a low-sticking coefficient metal is deposited over the hardmask 50 and cap layer 40. Dielectric layer may be formed using conventional CVD, PECVD, PVD deposition techniques. A thickness of the deposited dielectric material 205 can range from between about 15 nm to about 30 nm. Further, the forming of the dielectric layer redeposited dielectric layers results in a smoothing of the sidewalls 51, 52 of the hardmask 50 prior to conducting the stack etch. Examples of dielectric material deposited to form dielectric material layer 205 include amorphous carbon, SiON, SiN, SiOx or combinations thereof. Examples of low-sticking coefficient metal material deposited to form low-sticking coefficient metal material layer 205 include Ti, TiN, Nb, NbN or any. metals having a sticking coefficient of less than 0.2. The use of a low-sticking coefficient metal material 205 reduces the probability of redeposition.

FIG. 3B shows a resulting MRAM structure 201 after etching the MTJ stack layers 30 of FIG. 3A having either the overlying layer 205 of dielectric material or low-sticking coefficient metal. In one embodiment, the film material portions 215, 216 over the cap layer 40 is opened using a selective spacer-type etch, i.e., a CMOS fabrication chemical etching selective to the underlying MTJ cap layer 40. The spacer etch typically uses plasma etching with $CH_3F/O_2$ chemistry, or some variation ($CHF_3$, $CH_4$ or $C_2H_4$). In this embodiment, the MTJ stack etch may then be conducted using the sputter etching. In another embodiment, both film portion 205 and multi-layered MTJ stack and MTJ cap layers are etched during a sputter etching of the MTJ stack 30 as shown in FIG. 1B.

As shown in FIG. 3B, as a result of chemical spacer-process etching and/or sputter etching, the MTJ stack layer 30, metal cap layer 40 and the film portions 215, 220 formed over the cap layer 40 are removed except for under the hardmask feature 50, thereby isolating the MTJ structure of the MRAM memory element.

In the case of strictly sputter etching the multi-layered MTJ 30, any redeposited dielectric material(s) 92 of film 205 that results on the sidewalls 31 and 32 is insulating and does not impact resulting MTJ stack 30A. That is, any resultant redeposited dielectric material layers 81, 82 formed at respective MTJ stack sidewalls 31, 32, is non-conductive and does not impact MTJ device performance.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first electrically conductive structure embedded in an interconnect dielectric material layer and located in a magnetoresistive random access memory (MRAM) device area;
   a conductive landing pad located on a surface of the first electrically conductive structure in the MRAM device area;
   a multi-layered magnetic tunnel junction (MTJ) structure located on the conductive landing pad;
   a metal cap layer formed on a surface of said MTJ stack;
   a patterned metal hardmask layer on a surface of said cap layer; and
   a low-sticking coefficient metal film encapsulating a top surface and sidewall surfaces of said patterned hardmask layer, said low-sticking coefficient metal film is a low-sticking coefficient metal having a low-sticking coefficient value of less than 0.2.

2. The semiconductor structure as claimed in claim 1, wherein said patterned hardmask layer is a pillar structure.

3. The semiconductor structure as claimed in claim 2, wherein outermost sidewalls of both the MTJ cap and the MTJ structure are vertically aligned to outermost sidewalls of said patterned hardmask layer.

4. The semiconductor structure as claimed in claim 1, wherein said low-sticking coefficient metal is selected from the group comprising: Ti, TiN, Nb, NbN.

5. The semiconductor structure as claimed in claim 1, wherein a width of said patterned metal hardmask layer is reduced relative to a width of said metal cap layer.

* * * * *